United States Patent
Chang et al.

(10) Patent No.: US 7,479,733 B2
(45) Date of Patent: Jan. 20, 2009

(54) LIGHT-EMITTING DIODE PACKAGE STRUCTURE, COLD CATHODE FLOURESCENT LAMP AND PHOTOLUMINESCENT MATERIAL THEREOF

(75) Inventors: Chih-Chin Chang, Hsinchu (TW); Hsiang-Cheng Hsieh, Taoyuan County (TW); Teng-Huei Huang, Hsinchu County (TW)

(73) Assignee: LightHouse Technology Co., Ltd., Hsinchu County (TW)

( * ) Notice: Subject to any disclaimer, the term of this patent is extended or adjusted under 35 U.S.C. 154(b) by 594 days.

(21) Appl. No.: 11/160,287

(22) Filed: Jun. 17, 2005

(65) Prior Publication Data

US 2006/0214562 A1    Sep. 28, 2006

(30) Foreign Application Priority Data

Mar. 24, 2005    (TW) .............................. 94109063 A

(51) Int. Cl.
*H01J 1/62* (2006.01)
(52) U.S. Cl. ...................................... 313/503; 313/506
(58) Field of Classification Search ................. 313/498, 313/501, 502, 503, 506, 509, 512
See application file for complete search history.

(56) References Cited

U.S. PATENT DOCUMENTS

| | | | |
|---|---|---|---|
| 5,998,047 A | 12/1999 | Bechtel et al. ............... 428/690 |
| 5,998,925 A | 12/1999 | Shimizu et al. ............. 313/503 |
| 6,245,259 B1 | 6/2001 | Hohn et al. ............. 252/301.36 |
| 6,417,019 B1* | 7/2002 | Mueller et al. ................. 438/29 |
| 6,504,179 B1 | 1/2003 | Ellens et al. ................... 257/88 |
| 6,577,073 B2* | 6/2003 | Shimizu et al. ............. 315/246 |
| 6,592,780 B2 | 7/2003 | Hohn et al. ............. 252/301.36 |
| 6,669,866 B1 | 12/2003 | Kummer et al. ....... 252/301.4 R |
| 2002/0085601 A1 | 7/2002 | Wang et al. .................... 372/43 |
| 2003/0038596 A1* | 2/2003 | Ho .............................. 313/512 |

FOREIGN PATENT DOCUMENTS

| | | |
|---|---|---|
| DE | 196 38 667 | 4/1998 |
| DE | 102 47 021 | 4/2004 |
| DE | 10 2004 024 889 | 1/2005 |
| EP | 1 179 858 | 2/2002 |
| TW | 383508 | 3/2000 |

* cited by examiner

*Primary Examiner*—Vip Patel
(74) *Attorney, Agent, or Firm*—Jianq Chyun IP Office

(57) ABSTRACT

An LED package structure including a carrier, an LED chip, an encapsulant and a PL material is provided, wherein the LED chip is disposed on the carrier for emitting light. The encapsulant encapsulates the LED chip. The PL material is distributed in the encapsulant. The PL material is suitable for being excited by the light emitted from the LED chip and scattering the light. Moreover, the present invention provides a novel PL material with a molecular formula of $W_m Mo_n(Y,Ce,Tb,Gd,Sc)_{3+t+u}(Al,Ga,Tl,In,B)_{5+u+2v}(O,S,Se)_{12+2t+3u+3v+3m+3n}:Ce^{3+}, Tb^{3+}$, wherein $0<t<5$ and $0<m, n, u, v<15$.

12 Claims, 4 Drawing Sheets

LIGHT-EMITTING DIODE PACKAGE STRUCTURE, COLD CATHODE FLOURESCENT LAMP AND PHOTOLUMINESCENT MATERIAL THEREOF

CROSS-REFERENCE TO RELATED APPLICATION

This application claims the priority benefit of Taiwan application serial no. 94109063, filed on Mar. 24, 2005. All disclosure of the Taiwan application is incorporated herein by reference.

BACKGROUND OF THE INVENTION

1. Field of Invention

The present invention relates to an LED (light-emitting diode) package structure. More particularly, it relates to an LED package structure comprising a photoluminescent diffuser material.

2. Description of the Related Art

As LED luminous efficiency has continued to enhance in recent years, LEDs have gradually replaced fluorescent lamps and incandescent lamps in some applications, such as fast-responding scanner light sources, LCD (Liquid Crystal Display) back light sources, automobile dashboard lighting, traffic lights, and general lighting devices. In comparison with conventional light bulbs, LEDs have absolute predominance because of features, such as compact size, durability, low voltage/current operation, break-resistance, zero heat radiation during illumination, no mercury (and therefore no environmental pollution) and high luminous efficiency (energy saving). In terms of production technologies and applications today, white LED draws the most attention among LEDs' various lighting colors.

White light is a type of light blended from a plurality of colors of light. The white light visible to human eyes comprises at least two colors of light in different wavelengths. For example, blue light and yellow light are blended to form a dual-wavelength white light; or red light, green light and blue light are blended to form a triple-wavelength white light. Currently white LEDs are fabricated in three methods. First, there is a so-called triple-wavelength method, wherein an LED chip set is comprised of a red LED chip, a green LED chip and a blue LED chip. Uniform white light is formed by adjusting respective currents passing through the three chips. This mode features a high luminous efficiency along with a higher production cost. Second, there is a so-called dual-wavelength method, wherein an LED chip set is comprised of a blue LED chip and a yellow LED chip. By adjusting the respective currents of the two chips, uniform white light is formed. This method is characterized in good luminous efficiency and a lower production cost. Additionally, there is a third method, wherein white light is formed by blending blue light formed by a blue LED and yellow light formed by exciting blue light to form yellow phosphor. The third mode features a simpler production process, lower luminous efficiency and a lower cost. Therefore, currently, most white LEDs are based on the third method. Namely, the white light is formed by means of the blue light and the yellow phosphor excited by the blue light.

FIG. 1 is a schematic drawing of a conventional white LED package structure. In FIG. 1, the conventional white LED package structure mainly comprises package lead pins 100, a blue LED chip 102, an inner encapsulant 104 and an outer encapsulant 106, wherein the blue LED chip 102 is disposed on the package lead pins 100 and electrically connected to the package lead pins 100 via two soldering wires 108; the inner encapsulant 104 comprises yellow phosphor, covering the blue LED chip 102; an outer encapsulant 106 is used to cover part of the package lead pins 100, the blue LED chip 102 and the inner encapsulant 104. The aforesaid white LED uses the blue light emitted by the blue LED chip 102 to excite the inner encapsulant 104 to form a dual-wavelength white light, which is blended by the blue light and the yellow light.

FIG. 2 is a schematic drawing of another conventional white LED package structure. In comparison with FIG. 1, the major improvement of the white LED is an additional diffusion layer 110 applied to cover the inner encapsulant 104. The diffusion layer 110 comprises transparent glue in which transparent particles or air bubbles are distributed. The transparent particles or air bubbles in the diffusion layer 110 repeatedly refract the light rays, which enables the tone of the blended light to be more uniform.

However, to obtain a better light interfusing effect, the fluorescent powder on the above-described inner encapsulant 104 and the size and distributed density of transparent particles or air bubbles in the diffusion layer 110 must be well matched. Since too many factors can influence the light interfusing effect, practically it is difficult to some extent to produce and control the light interfusing effect.

To get a detailed understanding of the above-described LED package structure, U.S. Pat. No. 5,998,925 and the ROC patent PN 383508 can be used for reference.

SUMMARY OF THE INVENTION

According, the present invention is directed to provide an LED package structure to further enhance the light infusing effect thereof.

According, the present invention is to provide a cold cathode fluorescent lamp, wherein a photoluminescent material (PL material) is used to replace the conventional fluorescent layer and diffusion layer to enhance the light infusing effect thereof.

According, the present invention is to provide a PL material which is different from conventional fluorescent powder but suitable for the LED package structure and cold cathode fluorescent lamps to produce better light infusing effect.

The present invention provides an LED package structure, which mainly comprises a carrier, an LED chip, an encapsulant, and a PL material, wherein the LED chip is disposed on the carrier to emit light rays; the encapsulant is used to encapsulate the LED chip on the carrier; and the PL material is distributed in the encapsulant, wherein the photoluminescent material is adapted to be excited by the light emitted from the LED chip and to scatter the light.

According to one embodiment of the present invention, the carrier is, for example, a printed circuit board (PCB) comprising a chip-holding cell for disposing the LED chip. The LED chip is electrically connected to the PCB.

According to one embodiment of the present invention, the carrier is, for example, a package frame. The LED chip is electrically connected to the package frame via two soldering wires. Besides, the LED chip is, for example, a blue LED chip.

According to one embodiment of the present invention, the encapsulant comprises an inner encapsulant and an outer encapsulant, wherein the inner encapsulant encapsulates the LED chip and the PL material is distributed in the inner encapsulant, and the outer encapsulant encapsulates the inner encapsulant and a part of the carrier.

According to one embodiment of the present invention, the molecular formula of the PL material can be given by:

$W_mMo_n(Y,Ce,Tb,Gd,Sc)_{3+t+u}(Al,Ga,Tl,In,B)_{5+u+2v}(O,S,Se)_{12+2t+3u+3v+3m+3n}: Ce^{3+}, Tb^{3+}$, wherein $0<t<5$ and $0<m, n, u, v<15$. The aforesaid PL material with said molecular formula of: $W_mMo_n(Y,Ce,Tb,Gd,Sc)_{3+t+u}(Al,Ga,Tl,In,B)_{5+u+2v}(O,S,Se)_{12+2t+3u+3v+3m+3n}: Ce^{3+}, Tb^{3+}$, wherein $0<t<5$ and $0<m, n, u, v<15$, is a mixture or a sinter. In addition, the largest particle diameter is smaller than 30 microns and the average particle diameter is smaller than 10 microns.

According to one embodiment of the present invention, the PL material comprises a fluorescent material and a diffusion material. The particle diameter of the fluorescence material is smaller than 25 microns.

The present invention further provides an alternative cold cathode fluorescent lamp comprising a fluorescent lamp, discharging gas, PL material and an electrode set, wherein the discharging gas is filled in the fluorescent lamp, the PL material is disposed on the inner wall of the lamp and the electrode set comprises an anode and a cathode with the anode disposed at one end of the light tube and the cathode disposed at the other.

According to one embodiment of the present invention, the molecular formula of the PL material can be given by:

$W_mMo_n(Y,Ce,Tb,Gd,Sc)_{3+t+u}(Al,Ga,Tl,In,B)_{5+u+2v}(O,S,Se)_{12+2t+3u+3v+3m+3n}: Ce^{3+}, Tb^{3+}$, wherein $0<t<5$ and $0<m, n, u, v<15$. The PL material with the molecular formula of $W_mMo_n(Y,Ce,Tb,Gd,Sc)_{3+t+u}(Al,Ga,Tl,In,B)_{5+u+2v}(O,S,Se)_{12+2t+3u+3v+3m+3n}: Ce^{3+}, Tb^{3+}$, wherein $0<t<5$ and $0<m, n, u, v<15$ is a mixture or a sinter. In addition, the PL material comprises a fluorescent material and a diffusion material adhered by the fluorescent material.

The present invention also provides an alternative PL material. The molecular formula of the PL material can be given by:

$W_mMo_n(Y,Ce,Tb,Gd,Sc)_{3+t+u}(Al,Ga,Tl,In,B)_{5+u+2v}(O,S,Se)_{12+2t+3u+3v+3m+3n}: Ce^{3+}, Tb^{3+}$, wherein $0<t<5$ and $0<m, n, u, v<15$. Moreover, the PL material with the molecular formula of $W_mMo_n(Y,Ce,Tb,Gd,Sc)_{3+t+u}(Al,Ga,Tl,In,B)_{5+u+2v}(O,S,Se)_{12+2t+3u+3v+3m+3n}: Ce^{3+}, Tb^{3+}$, wherein $0<t<5$ and $0<m, n, u, v<15$, can be a mixture or a sinter.

The present invention uses a PL material to replace the conventional fluorescent layer and diffusion layer for light conversion and a light interfusing effect. Thus, there are no more match problems among the variants in the prior art, such as the materials of the fluorescent layer and diffusion layer, the particle size and the particle distribution density, and the like. Besides, the overall procedure for fabricating LED packages is effectively simplified along with a lower production cost and better light interfusing effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The First Embodiment

Figure 1:
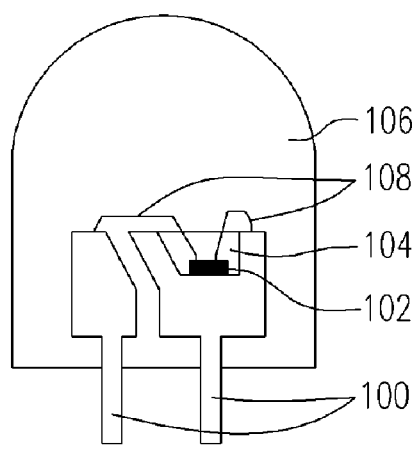
FIG. 1 is a schematic drawing of a conventional white LED package structure.
Figure 2:
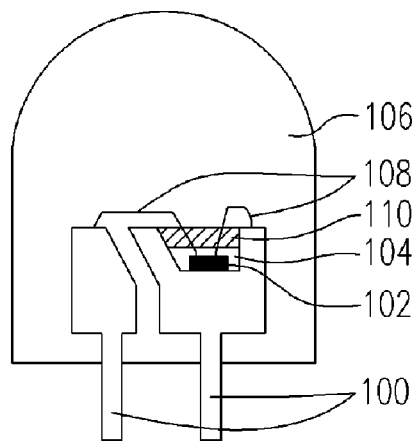
FIG. 2 is a schematic drawing of another conventional white LED package structure.
Figure 3:
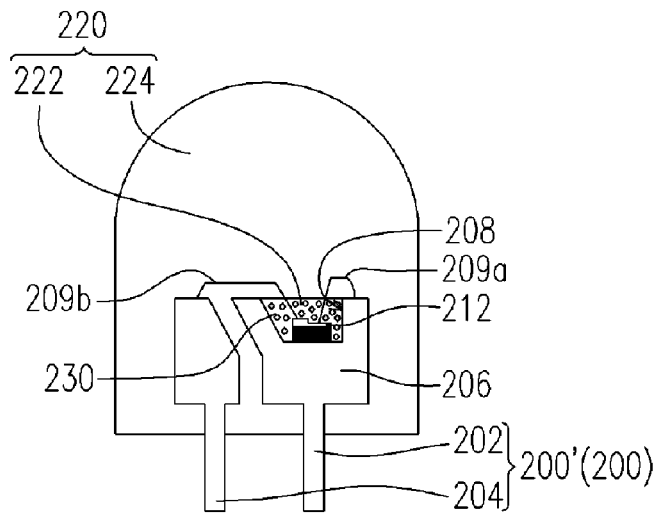
FIG. 3 is a schematic drawing of a white LED package structure according to a first embodiment of the present invention.

FIG. 3 is a schematic drawing of an LED package structure according to the first embodiment of the present invention. In FIG. 3, the LED package structure in the first embodiment of the present invention mainly comprises a carrier 200, an LED chip 210, an encapsulant 220 and a PL material 230, wherein the LED chip 210 is disposed on the carrier 200 to emit light; the encapsulant 220 encapsulates most of the carrier 200 and the LED chip 210 thereon; and the PL material 230 is evenly distributed in the encapsulant 220. The PL material layer 230 is suitable to be excited by the light emitted from the LED chip 210 and to scatter the light.

In the first embodiment, the carrier 200 is, for example, package lead pins 200' as shown in FIG. 3. The package lead pins 200' comprise a first lead pin 202 and a second lead pin 204. On the top of the first lead pin 202 is a carrier pad 206, comprising a chip-holding cell 208. The chip-holding cell 208 is of a concave shape suitable to hold the LED chip 210.

The LED chip 210 is disposed in the chip-holding cell 208 of the carrier pad 206 to emit light. In the first embodiment, the LED chip 210 is, for example, a blue LED chip. The surface of the LED chip 210 has electrodes 212, comprising a cathode and an anode, wherein the cathode is electrically connected to the first lead pin 202 and the anode to the second lead pin 204 respectively via soldering wires 209a and 209b.

The encapsulant 220 is used to encapsulate a portion of the package lead pins 200', the LED chip 210, the PL material 230, and the soldering wires 209a and 209b. The first lead pin 202 and the second lead pin 204 protrude from the bottom of the encapsulant 220. The encapsulant 220 comprises an inner encapsulant 222 and an outer encapsulant 224, wherein the inner encapsulant 222 encapsulates the LED chip 210, and the outer encapsulant 224 encapsulates the inner encapsulant 222 and a portion of the carrier 200.

Note that the PL material 230 in the present invention is uniformly distributed in the inner encapsulant 222. The PL material 230 serves as both a fluorescent layer and a diffusion layer of the prior art. That is, the PL material is not only excited by the light emitted from the LED chip 210, but is also capable of scattering the light. As a result, the light emitted from the LED chip 210 and the light formed by excited PL material 230 are blended more uniformly to further achieve a better light interfusing effect. The PL material 230 is not limited to the application of the inner encapsulant 222 in the first embodiment. The PL material 230 is also applicable to other package structure or lightings which are based on the excited phosphor to produce light. In all of these applications, a good light interfusing effect can be achieved.

Figure 4A:
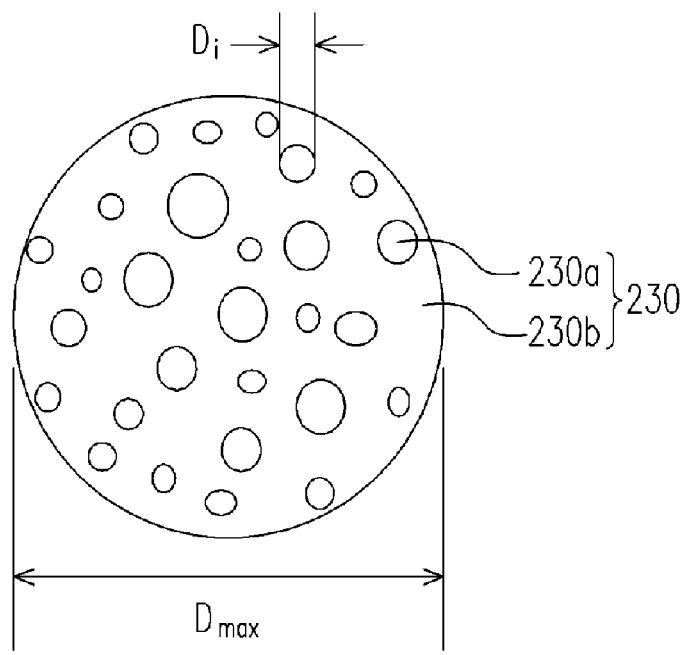
FIG. 4A and FIG. 4B are schematic diagrams showing a PL material.
Figure 4B:
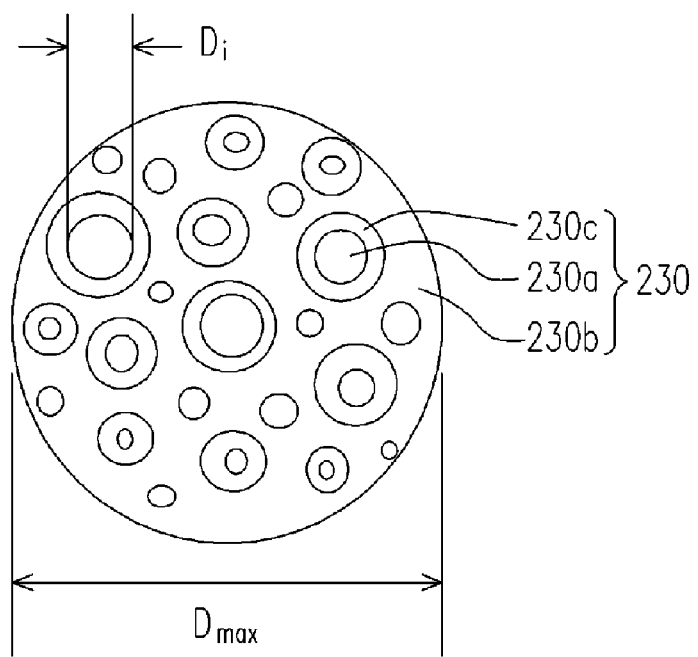

FIG. 4A and FIG. 4B are schematic diagrams showing a grain of the PL material. In FIG. 4A and FIG. 4B, the grain of the PL material 230 comprises a fluorescent material 230a and a diffusion material 230b adhering to the fluorescent material 230a which is distributed in the diffusion material 230b. As the incident light emitted from the LED chip 210 enters the PL material 230, the fluorescent material 230a inside the PL material 230 is excited and produces a light in other wavelength. Besides, the diffusion material 230b scatters the light onto other grains of the PL material 230, enabling the LED package structure to produce a better light interfusing effect. In FIG. 4B, there is a transitional-phase 230c embracing the fluorescence material 230a. The transitional-phase 230c may produced in certain condition when fabricating the PL material 230.

In the first embodiment, the molecular formula of the PL material 230 can be given by: $W_m Mo_n(Y,Ce,Tb,Gd,Sc)_{3+t+u}(Al,Ga,Tl,In,B)_{5+u+2v}(O,S,Se)_{12+2t+3u+3v+3m+3n}$: $Ce^{3+}$, $Tb^{3+}$, wherein 0<t<5 and 0<m, n, u, v<15. In FIG. 4A, to achieve a better light interfusing effect, the largest particle diameter of PL material Dmax is smaller than 30 microns, the average particle diameter thereof is smaller than 10 microns, and the particle diameter of fluorescent material Di is smaller than 25 microns. Moreover, the PL material with the molecular formula of $W_m Mo_n(Y,Ce,Tb,Gd,Sc)_{3+t+u}(Al,Ga,Tl,In,B)_{5+u+2v}(O,S,Se)_{12+2t+3u+3v+3m+3n}$: $Ce^{3+}$, $Tb^{3+}$, 0<t<5 and 0<m, n, u, v<15, can be a mixture or a sinter.

Figure 5A:
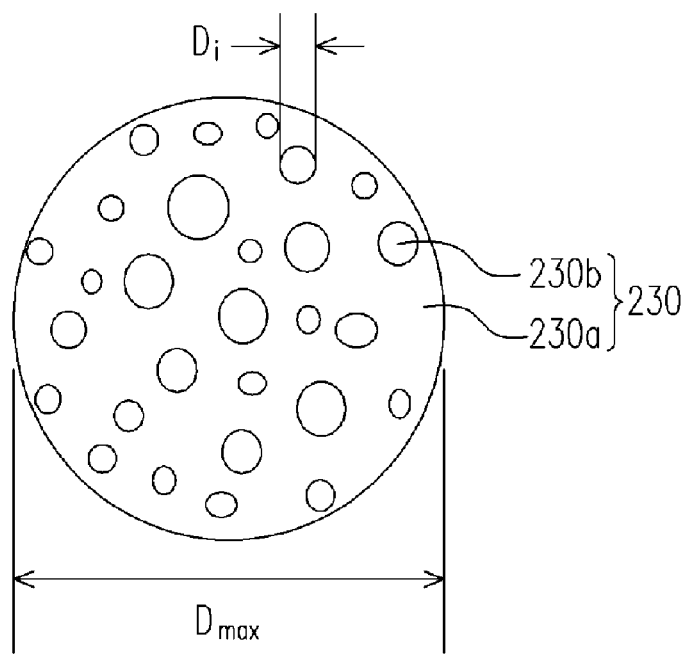
FIG. 5A and FIG. 5B are schematic diagrams showing an alternative PL material.
Figure 5B:
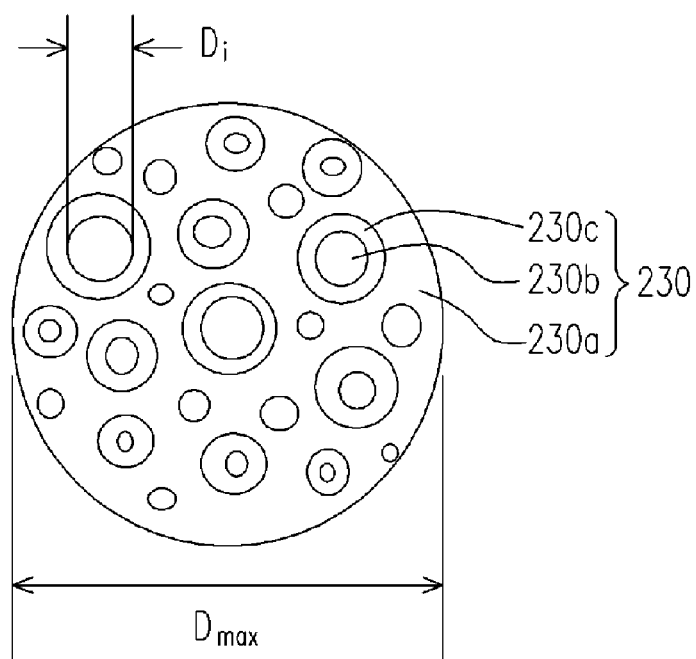

FIG. 5A and FIG. 5B are schematic diagrams showing a grain of an alternative PL material 230. In FIG. 5A and FIG. 5B, the grain of the PL material 230 comprises a fluorescent material 230a and a diffusion material 230b. The difference between FIG. 5A and FIG. 5B is that the diffusion material 230b of the PL material 230 is distributed in the fluorescent material 230a. The alternative PL material 230 can also achieve the same light interfusing effect.

It is known to those skilled in the art that the disclosed PL material 230 is not limited to the aforesaid package structure. In fact, the disclosed PL material 230 is also applicable to any package structure based on the excited-phosphor mode to produce light. To reach the goal, the original fluorescent layer needs to be replaced by an inner encapsulant 222 and a PL material 230 distributed therein.

The Second Embodiment

Figure 6:
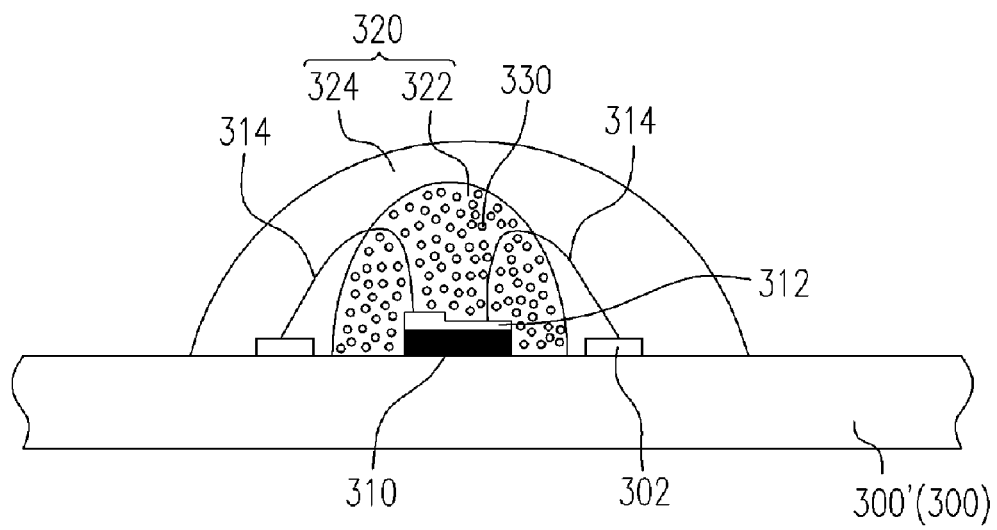
FIG. 6 and FIG. 7 are schematic drawings of white LED packages structure according to a second embodiment of the present invention.
Figure 7:
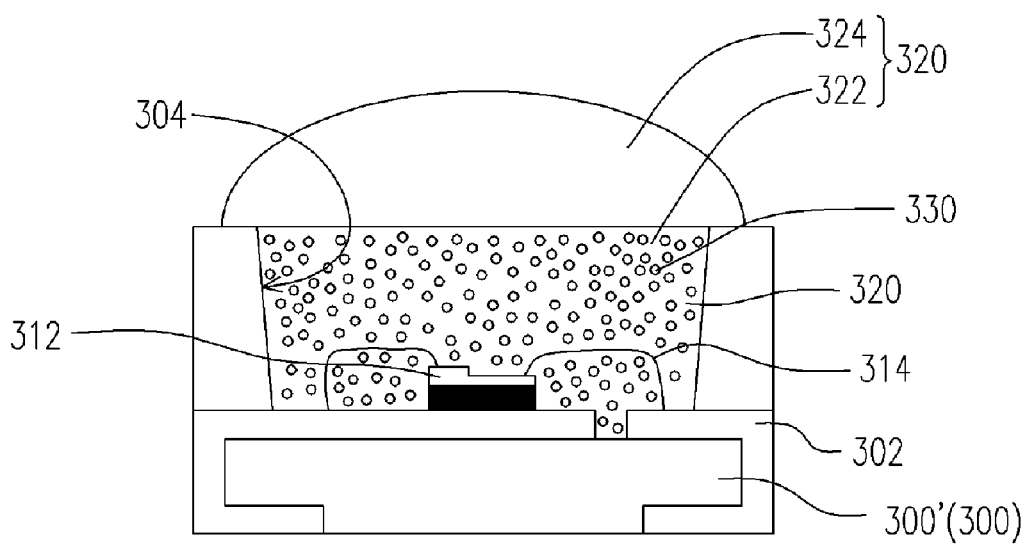

FIG. 6 and FIG. 7 are schematic drawings of white LED package structures according to the second embodiment of the present invention. In FIG. 6, the structure in the second embodiment is similar to that of the first embodiment. The difference in the second embodiment is that the carrier 300 therein is a printed circuit board (PCB) 300' on which the package is disposed.

The LED package structure in the second embodiment mainly comprises a PCB 300', an LED chip 310, an encapsulant 320 and a PL material 330. The encapsulant 320 similarly comprises an inner encapsulant 322 and an outer encapsulant 324, wherein the inner encapsulant 322 encapsulates the LED chip 310, and the outer encapsulant 324 encapsulates a portion of the PCB 300', the LED chip 310, the inner encapsulant 322, the PL material 330 and the soldering wires 314. When the encapsulant 320 comprises only an outer encapsulant 324 without the inner encapsulant 322, the outer encapsulant 324 can only comprise the PL material 330.

The LED chip 310 is disposed on the PCB 300'. Connection pads 302 and electrodes 312 are disposed on the PCB 300' and the LED chip 310, respectively. The electrodes 312 are connected to the connection pads 302 on the PCB 300' through two soldering wires 314, so that the PCB 300' is electrically connected to the LED chip 310.

The inner encapsulant 322 is disposed on the PCB 300' and covers the aforesaid LED chip 310. The PL material 330 is uniformly distributed in the inner encapsulant 322 and comprises a fluorescent material and a diffusion material adhering to the fluorescent material. When the incidence light from the LED chip 310 enters the PL material 330, the fluorescent material therein is excited and produces a light with a different wavelength. The diffusion material scatters the light onto other particles of the PL material to produce a better light interfusing effect. In the second embodiment, the molecular formula of the PL material 330 can be given by:
$W_m Mo_n(Y,Ce,Tb,Gd,Sc)_{3+t+u}(Al,Ga,Tl,In,B)_{5+u+2v}(O,S,Se)_{12+2t+3u+3v+3m+3n}$: $Ce^{3+}$, $Tb^{3+}$, wherein 0<t<5 and 0<m, n, u, v<15. To achieve a better light interfusing effect the largest particle diameter of the PL material 330 Dmax is, similarly, smaller than 30 microns, the average particle diameter thereof is smaller than 10 microns, and the particle diameter of fluorescent material Di is smaller than 25 microns. Moreover, the PL material with the molecular formula of $W_m Mo_n(Y,Ce,Tb,Gd,Sc)_{3+t+u}(Al,Ga,Tl,In,B)_{5+u+2v}(O,S,Se)_{12+2t+3u+3v+3m+3n}$: $Ce^{3+}$, $Tb^{3+}$, wherein 0<t<5 and 0<m, n, u, v<15, can be a mixture or a sinter.

In FIG. 7, to enhance the light-condensing effect of the LED package structure, a chip-holding cell 304 is disposed in the PCB 300'. The chip-holding cell 304 is of a concave-cup shape suitable for holding the LED chip 310. Moreover, a reflecting-film layer can be plated on the sidewall of the chip-holding cell 304 as an option of increasing the light-reflection effect.

The Third Embodiment

In the first and second embodiment of the present invention, the PL material is used in the LED package structure. In addition, the PL material can also be used in general cold cathode fluorescent lamps to achieve a better light interfusing effect.

Figure 8:
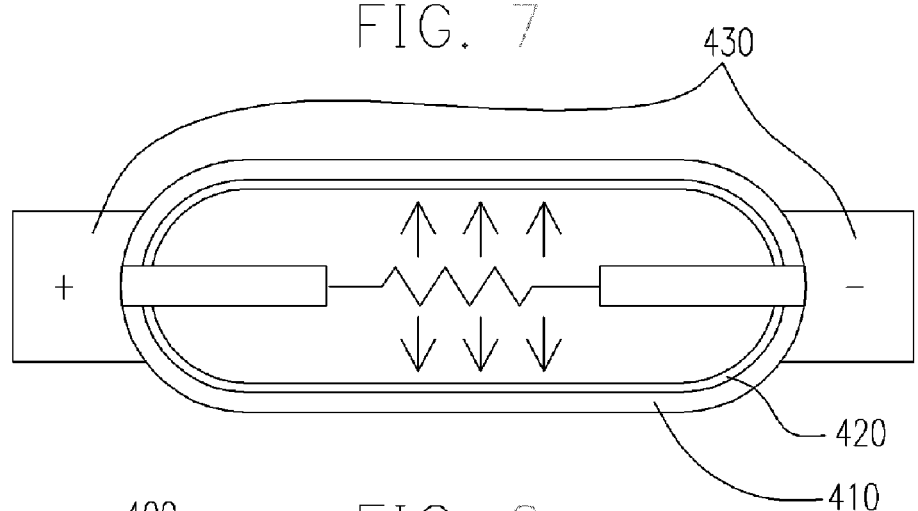
FIG. 8 is a schematic drawing of a cold cathode fluorescent lamp according to a third embodiment of the present invention.

FIG. 8 is a schematic drawing of a cold cathode fluorescent lamp according to the third embodiment of the present invention. In FIG. 8, the cold cathode fluorescent lamp 400 comprises a light tube 410, a discharging gas (not shown in the figure), a PL material 420 and an electrode set 430, wherein the light tube 110 is properly filled with discharging gas, such as mercury vapor and inert gas. The PL material 420 is applied on the inner wall of the light tube 410. In addition, the electrode set 430 comprises both an anode and a cathode individually disposed at two ends of the light tube 410, respectively. The electrode set 430 is electrically connected to a power supply (not shown in the figure).

When a bias voltage is applied to the electrode set 430, the discharging gas in the light tube, such as the mercury vapor and the inert gas, is excited to an excited state, then returns to a steady state. While the discharging gas returns to the steady state, the gas releases energy by emitting an ultraviolet light. With the aforesaid mechanism, when the ultraviolet light released by the discharging gas reaches the PL material 420 on the wall of the light tube 410, the PL material comprising the fluorescent material and the diffusion material adhering to the florescent material emits a visible light to achieve lighting effect. Meanwhile, the diffusion material adhering to the fluorescent material scatters the light to produce a better light interfusing effect. The limitations of the PL material molecular formula and the particle size are the same as described in the first and second embodiment, so it is not repeated.

To sum up, in the LED package structure of the present invention, the aforesaid PL material is used to replace the fluorescent layer and the diffusion layer of the prior art. The molecular formula of the PL material 330 can be given by: $W_m Mo_n(Y,Ce,Tb,Gd,Sc)_{3+t+u}(Al,Ga,Tl,In,B)_{5+u+2v}(O,S,Se)_{12+2t+3u+3v+3m+3n}$: $Ce^{3+}$, $Tb^{3+}$, wherein 0<t<5 and 0<m, n, u, v<15. The PL material is not only excited by the light emitted from the aforesaid LED chip, but also scatters the light. Thus, the light emitted from the LED chip and the light excited by the PL material are blended more uniformly to achieve a better light infusing effect.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A light-emitting diode (LED) package structure, comprising:

a carrier;

an LED chip disposed on the carrier and suitable for emitting light;

an encapsulant for encapsulating the LED chip on the carrier, and a photoluminescent material distributed in the encapsulant, wherein the molecular formula of the photoluminescent material is given by:

$W_m Mo_n (Y,Ce,Tb,Gd,Sc)_{3+t+u} (Al,Ga,Tl,In,B)_{5+u+2v} (O,S,Se)_{12+2t+3u+3v+3m+3n}: Ce^{3+}, Tb^{3+}$, wherein 0<t<5 and 0<m, n, u, v<15.

2. The LED package structure of claim 1, wherein the carrier is a printed circuit board (PCB) and the LED chip is electrically connected to the PCB.

3. The LED package structure of claim 2, wherein there is a chip-holding cell on the PCB suitable for holding the LED chip.

4. The LED package structure of claim 1, wherein the carrier is a package frame electrically connected to the LED chip.

5. The LED package structure of claim 4, further comprising two soldering wires electrically connected between the LED chip and the package frame.

6. The LED package structure of claim 1, wherein the LED chip is a blue LED chip.

7. The LED package structure of claim 1, wherein the encapsulant comprises:

an inner encapsulant for encapsulating the LED chip, wherein the photoluminescent material are distributed; and an outer encapsulant for encapsulating the inner encapsulant and a portion of the carrier.

8. The LED package structure of claim 1, wherein the photoluminescent material with the molecular formula of $W_m Mo_n (Y,Ce,Tb,Gd,Sc)_{3+t+u} (Al,Ga,Tl,In,B)_{5+u+2v} (O,S,Se)_{12+2t+3u+3v+3m}: Ce^{3+}, Tb^{3+}$, wherein 0<t<5 and 0<m, n, u, v<15, is a mixture.

9. The LED package structure of claim 1, wherein the photoluminescent material with the molecular formula of $W_m Mo_n (Y,Ce,Tb,Gd,Sc)_{3+t+u} (Al,Ga,Tl,In,B)_{5+u+2v} (O,S,Se)_{12+2t+3u+3v+3m+3n}: Ce^{3+}, Tb^{3+}$, wherein 0<t<5 and 0<m, n, u, v<15, is a sinter.

10. The LED package structure of claim 1, wherein the largest particle diameter of the photoluminescent material is smaller than 30 microns and the average particle diameter thereof is smaller than 10 microns.

11. The LED package structure of claim 1, wherein the photoluminescent material comprises a fluorescent material and a diffusion material adhering to the fluorescent material.

12. The LED package structure of claim 11, wherein the particle diameter of the fluorescent material is smaller than 25 microns.

* * * * *